US012082411B2

United States Patent
Zhang et al.

(10) Patent No.: US 12,082,411 B2
(45) Date of Patent: Sep. 3, 2024

(54) THREE-DIMENSIONAL MEMORY DEVICE WITH BACKSIDE INTERCONNECT STRUCTURES

(71) Applicant: YANGTZE MEMORY TECHNOLOGIES CO., LTD., Wuhan (CN)

(72) Inventors: Kun Zhang, Wuhan (CN); Zhong Zhang, Wuhan (CN); Lei Liu, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 927 days.

(21) Appl. No.: 17/020,383

(22) Filed: Sep. 14, 2020

(65) Prior Publication Data
US 2021/0320122 A1 Oct. 14, 2021

Related U.S. Application Data

(63) Continuation of application No. PCT/CN2020/100567, filed on Jul. 7, 2020.

(51) Int. Cl.
*H10B 43/27* (2023.01)
*H01L 23/528* (2006.01)
(Continued)

(52) U.S. Cl.
CPC .......... *H10B 43/27* (2023.02); *H01L 23/5283* (2013.01); *H10B 41/10* (2023.02);
(Continued)

(58) Field of Classification Search
CPC ........ H10B 43/27; H10B 41/50; H10B 41/35; H10B 43/35; H10B 43/40; H10B 41/40;
(Continued)

(56) References Cited

U.S. PATENT DOCUMENTS 9,224,747 B2 * 12/2015 Mizutani ................ H10B 43/35
9,356,034 B1 5/2016 Yada et al.
(Continued)

FOREIGN PATENT DOCUMENTS

CN 109786387 A 5/2019
CN 110494979 A 11/2019
(Continued)

OTHER PUBLICATIONS

Supplementary European Search Report issued in corresponding European Application No. 20 93 1411, mailed on Apr. 30, 2024, 9 pages.

*Primary Examiner* — Mouloucoulaye Inoussa
(74) *Attorney, Agent, or Firm* — BAYES PLLC

(57) ABSTRACT

Embodiments of 3D memory devices and methods for forming the same are disclosed. In an example, a 3D memory device includes a substrate, a memory stack including interleaved conductive layers and dielectric layers above the substrate, a plurality of channel structures each extending vertically through the memory stack, a semiconductor layer above and in contact with the plurality of channel structures, a plurality of source contacts above the memory stack and in contact with the semiconductor layer, a plurality of contacts through the semiconductor layer, and a backside interconnect layer above the semiconductor layer including a source line mesh in a plan view. The plurality of source contacts are distributed below and in contact with the source line mesh. A first set of the plurality of contacts are distributed below and in contact with the source line mesh.

20 Claims, 10 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............ *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 41/10; H10B 43/50; H10B 41/27; H10B 43/10; H10B 43/30; H10B 20/50; H10B 63/84; H10B 63/34; H01L 23/5283; H01L 24/80; H01L 23/585; H01L 23/562; H01L 29/1037; H01L 21/823475; H01L 23/528; H01L 27/0688; H01L 21/8221; H01L 21/76805; H01L 21/76877; H01L 23/5226; H01L 23/3192; H01L 23/522; H01L 21/761; H01L 27/1207; H01L 23/53295; H01L 23/535; H01L 2224/08058; H01L 2224/80896; H01L 2224/08145; H01L 2224/80895; H01L 2224/09517; H01L 2224/80894; H01L 2225/06575; H01L 2225/06562; H01L 2225/06568; H01L 2225/06582; H01L 2225/06527; H01L 2924/0002; H01L 21/76264; H01L 2224/8083; H01L 2224/8089; H01L 2924/14511; H01L 2224/05647; H01L 2924/1431; H01L 2924/00014; G11C 16/3459; G11C 16/0483; G11C 16/10
USPC ................ 257/324, 401, E29.309, E21.409; 438/261, 287
See application file for complete search history.

(56) References Cited

U.S. PATENT DOCUMENTS

| | | | |
|---|---|---|---|
| 9,876,031 B1* | 1/2018 | Shimizu | H10B 43/27 |
| 10,074,667 B1* | 9/2018 | Higashi | H10B 41/23 |
| 10,141,326 B1* | 11/2018 | Oh | H10B 43/40 |
| 10,381,362 B1 | 8/2019 | Cui et al. | |
| 10,510,415 B1* | 12/2019 | Huo | H01L 29/42384 |
| 10,600,763 B1* | 3/2020 | Xiao | H01L 21/8221 |
| 10,896,918 B1* | 1/2021 | Oh | H01L 21/76877 |
| 2010/0090286 A1* | 4/2010 | Lee | H10B 43/20 257/E27.081 |
| 2014/0054672 A1* | 2/2014 | Kim | H01L 29/40117 257/324 |
| 2014/0054674 A1* | 2/2014 | Kim | H10B 43/40 257/324 |
| 2015/0129878 A1* | 5/2015 | Shin | H01L 29/7926 257/329 |
| 2015/0179660 A1* | 6/2015 | Yada | H01L 29/40117 257/314 |
| 2015/0340366 A1* | 11/2015 | Lim | G11C 16/10 257/401 |
| 2016/0148946 A1* | 5/2016 | Hironaga | H10B 43/27 438/586 |
| 2016/0162635 A1* | 6/2016 | Keller | G16B 20/20 702/20 |
| 2017/0025421 A1* | 1/2017 | Sakakibara | H10B 41/27 |
| 2017/0256551 A1 | 9/2017 | Lee | |
| 2017/0317088 A1 | 11/2017 | Lee | |
| 2018/0122904 A1 | 5/2018 | Matsumoto et al. | |
| 2018/0277499 A1* | 9/2018 | Oshiki | H10B 43/10 |
| 2018/0374864 A1* | 12/2018 | Fukuzumi | H01L 21/185 |
| 2019/0043836 A1* | 2/2019 | Fastow | H01L 27/0688 |
| 2019/0043868 A1 | 2/2019 | Hasnat et al. | |
| 2019/0057898 A1* | 2/2019 | Shim | H10B 43/50 |
| 2019/0081054 A1* | 3/2019 | Kim | G11C 16/0441 |
| 2019/0081069 A1* | 3/2019 | Lu | H10B 43/50 |
| 2019/0221557 A1* | 7/2019 | Kim | H10B 43/50 |
| 2019/0221558 A1 | 7/2019 | Chen et al. | |
| 2019/0229125 A1* | 7/2019 | Zhou | H10B 41/27 |
| 2019/0237472 A1 | 8/2019 | Oh et al. | |
| 2019/0273069 A1 | 9/2019 | Or-Bach et al. | |
| 2019/0287894 A1* | 9/2019 | Nakajima | H10B 43/40 |
| 2019/0326315 A1 | 10/2019 | Lee et al. | |
| 2019/0333929 A1* | 10/2019 | Lee | H10B 41/20 |
| 2020/0006299 A1* | 1/2020 | Liu | H01L 25/105 |
| 2020/0058669 A1* | 2/2020 | Chen | H10B 43/27 |
| 2020/0075623 A1* | 3/2020 | Ito | H10B 43/50 |
| 2020/0083242 A1 | 5/2020 | Jeong et al. | |
| 2020/0144242 A1* | 5/2020 | Park | H10B 41/50 |
| 2020/0194452 A1* | 6/2020 | Xiao | H01L 23/5226 |
| 2020/0203329 A1* | 6/2020 | Kanamori | H01L 24/09 |
| 2020/0203364 A1 | 6/2020 | Totoki et al. | |
| 2020/0227397 A1* | 7/2020 | Yada | H10B 43/40 |
| 2020/0251149 A1* | 8/2020 | Zhang | H01L 25/0657 |
| 2020/0258857 A1* | 8/2020 | Huo | H01L 24/19 |
| 2020/0286842 A1* | 9/2020 | Sanuki | H10B 43/40 |
| 2020/0312765 A1* | 10/2020 | Kawasaki | H10B 43/50 |
| 2020/0328186 A1* | 10/2020 | Liu | H01L 24/83 |
| 2020/0350014 A1* | 11/2020 | Liu | G11C 14/0018 |
| 2020/0357811 A1* | 11/2020 | Kim | H10B 41/35 |
| 2020/0402923 A1* | 12/2020 | Shim | H01L 23/585 |
| 2020/0402996 A1* | 12/2020 | Cheon | H10B 43/10 |
| 2020/0411542 A1* | 12/2020 | Yang | H10B 41/50 |
| 2021/0035965 A1* | 2/2021 | Mizutani | H01L 25/18 |
| 2021/0036001 A1* | 2/2021 | Kim | H01L 23/5223 |
| 2021/0036010 A1* | 2/2021 | Sim | H10B 43/10 |
| 2021/0043641 A1* | 2/2021 | Yun | H10B 43/10 |
| 2021/0066282 A1* | 3/2021 | Kim | H10B 43/40 |
| 2021/0082897 A1* | 3/2021 | Okada | H01L 24/09 |
| 2021/0134819 A1* | 5/2021 | Zhang | H10B 41/50 |
| 2021/0210428 A1* | 7/2021 | Ohsawa | H10B 43/10 |
| 2021/0210498 A1* | 7/2021 | Leobandung | G11C 16/24 |
| 2021/0225736 A1* | 7/2021 | Kim | H01L 21/76877 |
| 2021/0225864 A1* | 7/2021 | Zhang | H01L 21/76877 |
| 2021/0296324 A1* | 9/2021 | Lim | H10B 43/40 |
| 2021/0305271 A1* | 9/2021 | Kim | H10B 43/40 |
| 2021/0366855 A1* | 11/2021 | Okina | H01L 24/08 |
| 2021/0375847 A1* | 12/2021 | Chibvongodze | H01L 24/49 |

FOREIGN PATENT DOCUMENTS

| | | |
|---|---|---|
| CN | 111370416 A | 7/2020 |
| JP | 2019161059 A | 9/2019 |
| TW | 202023037 A | 6/2020 |

\* cited by examiner ary one of the source contacts. The source line mesh is above and in contact with each of the source contacts.

In still another example, a method for forming a 3D memory device is disclosed. A peripheral circuit is formed on a first substrate. A plurality of channel structures each extending vertically through a memory stack on a front side of a second substrate are formed. The first substrate and the second substrate are bonded in a face-to-face manner, such that the channel structures are above the peripheral circuit. The second substrate is thinned. A plurality of contacts through the thinned second substrate and a plurality of source contacts in contact with the thinned second substrate are formed. A source line mesh is formed on the backside of the thinned second substrate, such that the source line mesh is above and in contact with the plurality of source contacts and a first set of the plurality of contacts.

THREE-DIMENSIONAL MEMORY DEVICE WITH BACKSIDE INTERCONNECT STRUCTURES

CROSS-REFERENCE TO RELATED APPLICATIONS

This application is continuation of International Application No. PCT/CN2020/100567, filed on Jul. 7, 2020, entitled "THREE-DIMENSIONAL MEMORY DEVICE WITH BACKSIDE INTERCONNECT STRUCTURES," which claims the benefit of priorities to International Application No. PCT/CN2020/084600, filed on Apr. 14, 2020, entitled "THREE-DIMENSIONAL MEMORY DEVICE WITH BACKSIDE SOURCE CONTACT," and International Application No. PCT/CN2020/084603, filed on Apr. 14, 2020, entitled "METHOD FOR FORMING THREE-DIMENSIONAL MEMORY DEVICE WITH BACKSIDE SOURCE CONTACT," all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack including interleaved conductive layers and dielectric layers above the substrate, a plurality of channel structures each extending vertically through the memory stack, a semiconductor layer above and in contact with the plurality of channel structures, a plurality of source contacts above the memory stack and in contact with the semiconductor layer, a plurality of contacts through the semiconductor layer, and a backside interconnect layer above the semiconductor layer including a source line mesh in a plan view. The plurality of source contacts are distributed below and in contact with the source line mesh. A first set of the plurality of contacts are distributed below and in contact with the source line mesh.

In another example, a 3D memory device includes a substrate, a memory stack including interleaved conductive layers and dielectric layers above the substrate, a plurality of channel structures each extending vertically through the memory stack, a semiconductor layer above and in contact with the plurality of channel structures, a plurality of source contacts in contact with the semiconductor layer, and a backside interconnect layer above the semiconductor layer including a source line mesh in a plan view. Each of the channel structures is below and aligned laterally with a respect

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
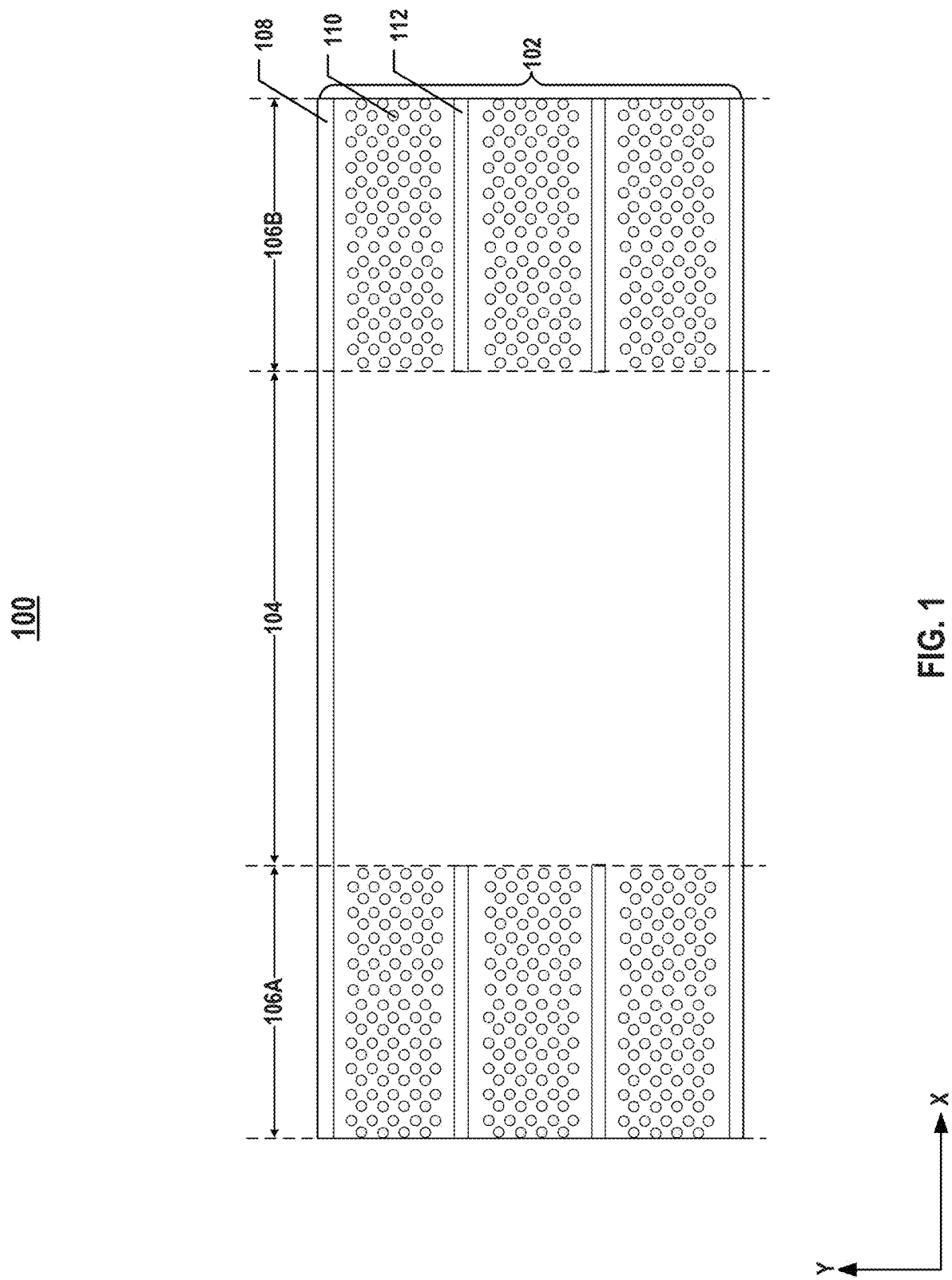
FIG. 1 illustrates a plan view of a cross-section of an exemplary 3D memory device having a center staircase region, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, the periphery circuits and memory array are stacked to save wafer area and increase memory cell density. For example, direct bonding technologies have been proposed to fabricate some 3D NAND memory devices (e.g., having 96-layers or more) by joining peripheral device and memory array on different substrates in a face-to-face manner. The memory array substrate is then thinned for forming through-silicon vertical interconnect access (VIA), known as "TSV" therethrough to vertical interconnections and pad-out on the backside of the thinned substrate with wire bonding pads. However, as only wire bonding pads and TSVs are formed on the backside of the thinned substrate (i.e., the top surface of the bonded 3D memory device), a substantial amount of area on the backside of the thinned substrate is wasted.

Various embodiments in accordance with the present disclosure provide 3D memory devices with backside interconnect structure to better utilize the backside area and optimize the metal routings. Some or all of the source lines, source select gate (SSG) lines, and power lines can be moved from the front side of the memory array substrate (i.e., in the middle of the bonded 3D memory device) to the backside of the memory array substrate (i.e., on the top surface of the bonded 3D memory device) as the "backside interconnect structures." In some embodiments, the backside source lines allow source contacts to be formed on the backside of the memory array substrate as well, which can avoid leakage current and parasitic capacitance between the word lines and source contacts on the front side through the memory stack. The various backside interconnect structures can be arranged in different layouts, such as a mesh (e.g., comb-like shape) or parallel straight lines, to optimize the metal routings and reduce the overall resistance based on different memory array structures to further improve the electrical performance of the 3D memory devices.

FIG. 1 illustrates a plan view of a cross-section of an exemplary 3D memory device 100 having a center staircase region, according to some embodiments of the present disclosure. As shown in FIG. 1, the memory stack of 3D memory device 100 can include two core array regions 106A and 106B having channel structures 110 therein and a staircase region 104 between core array regions 106A and 106B in a first lateral direction in the plan view. It is noted that x and y axes are included in FIG. 1 to illustrate two orthogonal directions in the wafer plane. The x-direction is the word line direction, and the y-direction is the bit line direction. 3D memory device 100 includes center staircase region 104 laterally separating the memory stack in the x-direction (e.g., the word line direction) into two parts: a first core array region 106A and a second core array region 106B, each of which includes an array of channel structures 110, according to some embodiments.

3D memory device 100 also includes parallel insulating structures 108 (e.g., gate line slits (GLSs)) in the y-direction (e.g., the bit line direction) each extending laterally in the x-direction to separate core array regions 106A and 106 and arrays of channel structures 110 therein into blocks 102, according to some embodiments. 3D memory device 100 can further include parallel drain select gate (DSG) cuts 112 (sometimes known as top select gate (TSG) cuts) in the y-direction in block 102 to further separate block 102 into fingers. It is understood that the layout of the staircase region and core array regions is not limited to the example of FIG. 1 and may include any other suitable layouts, such as having side staircase regions at the edges of the memory stack in other examples.

The cross-section of 3D memory device 100 is on the front side of 3D memory device 100 on which channel structures 110 are formed. In some embodiments, 3D memory device 100 is flipped upside down and bonded to another semiconductor device, such as a peripheral device having peripheral circuits for facilitating the operations of 3D memory device 100. Thus, the backside of 3D memory device 100 can become the top surface of the bonded device, which can be used for pad-out. As described below in detail, the area on the backside of 3D memory device 100 (i.e., the top surface of the bonded device) can be utilized to form, besides bonding pads, various backside interconnect structures in various layouts to optimize the metal routings and reduce the overall resistance as well as reduce leakage current and parasitic capacitance on the front side of 3D memory device 100.

Figure 2A:
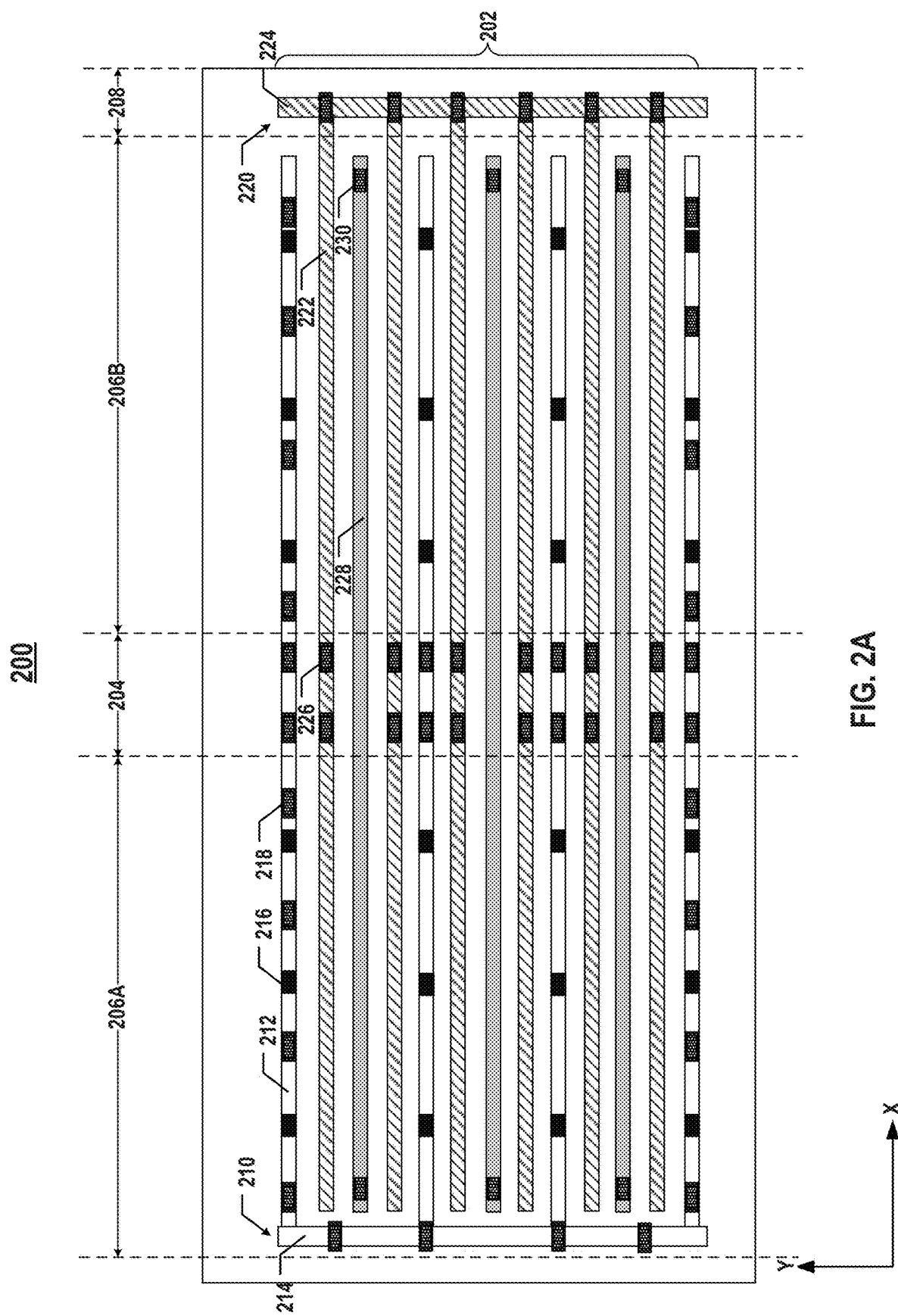
FIG. 2A illustrates a plan view of a cross-section of an exemplary 3D memory device with backside interconnect structures, according to some embodiments of the present disclosure.

FIG. 2A illustrates a plan view of a cross-section of an exemplary 3D memory device 200 with backside interconnect structures, according to some embodiments of the present disclosure. 3D memory device 200 may be one example of 3D memory device 100 after flip-chip bonding, and FIG. 2A shows one example of the backside of 3D memory device 100 after flip-chip bonding. As shown in FIG. 2A, the memory stack of 3D memory device 200 includes two core array regions 206A and 206B having channel structures therein (not shown) and a staircase region 204 between core array regions 206A and 206B in the x-direction (e.g., the word line direction) in the plan view, according to some embodiments. In some embodiments, 3D memory device 200 further includes a peripheral region 208 outside of core array region 206A or 206B of the memory stack in the plan view. In the y-direction (e.g., the bit line direction), FIG. 2A shows backside interconnect structures in one block 202 of 3D memory device 200, which may be repeated in any suitable number of times in multiple blocks.

In some embodiments, 3D memory device 200 includes a source line mesh 210 in the plan view. As shown in FIG. 2A, source line mesh 210 has a comb-like shape, according to some embodiments. For example, source line mesh 210 may include a shaft source line 214 extending laterally in the y-direction (e.g., the bit line direction) in one of core array regions 206A and 206B. Source line mesh 210 may also include a plurality of parallel tooth source lines 212 each extending laterally from shaft source line 214 in one core array region 206A in the x-direction (e.g., the word line direction) through staircase region 204 to another core array region 206B. In some embodiments, source line mesh 210 is in core array regions 206A and 206B and staircase region 204, for example, extending in the x-direction across core array regions 206A and 206B and staircase region 204, but not in peripheral region 208.

3D memory device 200 can also include backside source contacts 216 (e.g., in the form of VIA contacts) in core array regions 206A and 206B, but not in staircase region 204 or peripheral region 208. For example, backside source contacts 216 may be evenly distributed in core array region 206A or 206B. In some embodiments, backside source contacts 216 are distributed below and in contact with source line mesh 210. For example, backside source contacts 216 may be evenly distributed below and in contact with source line mesh 210 in core array region 206A or 206B. That is, the distances between adjacent backside source contacts 216 (e.g., in the x-direction and/or the y-direction) are the same in core array region 206A or 206B. In some embodiments, backside source contacts 216 are distributed below and in contact with tooth source lines 212 of source line mesh 210, but not shaft source line 214 of source line mesh 210. It is understood that in some examples, backside source contacts 216 in the form of VIA contacts may be replaced by one or more source wall-shaped contacts, i.e., interconnect lines.

3D memory device 200 can further include a plurality of sets of contacts 218, 226 and 230, such as through-silicon contacts (TSCs). In some embodiments, contacts 218 are distributed below and in contact with source line mesh 210 in staircase region 204 and part of core array regions 206A and 206B. As contacts 218 may be TSCs extending through the silicon substrate, contacts 218 are distributed below and in contact with the peripheral portion of source line mesh 210 (including the part in staircase region 204) to avoid overlapping with the channel structures in the center portion of source line mesh 210 in core array regions 206A and 206B, according to some embodiments. For example, as shown in FIG. 2A, contacts 218 may be distributed below and in contact with shaft source line 214 and the outermost tooth source lines 212 of source line mesh 210 in core array regions 206A and 206B. Contacts 218 may also be distributed below and in contact with each tooth source line 212 of source line mesh 210 in staircase region 204.

As described below in detail, each backside source contact 216 can be electrically connected to the common source (e.g., array common source (ASC)) of NAND memory strings in block 202, and source line mesh 210 electrically connects each backside source contact 216 and is in turn, electrically connected to the common source of NAND memory strings in block 202. Similarly, each contact 218 can be electrically connected to the peripheral circuits of 3D memory device 200, and source line mesh 210 electrically connects each contact 218 and is in turn, electrically connected to the peripheral circuits of 3D memory device 200. As a result, the peripheral circuits can be electrically connected to the common source of NAND memory strings in block 202 to control and/or sense the common source through the metal routing including contacts 218, source line mesh 210, and backside source contacts 216 on the backside of 3D memory device 200. The layout of contacts 218, source line mesh 210, and backside source contacts 216, for example, the comb-like shape of source line mesh 210 and multiple distributed contacts 218 and backside source contacts 216, can reduce the overall resistance of the metal routing.

In some embodiments, 3D memory device 200 includes another backside interconnect structure—a power line mesh 220 in the plan view. As shown in FIG. 2A, power line mesh 220 has a comb-like shape, according to some embodiments. For example, power line mesh 220 may include a shaft power line 224 extending laterally in the y-direction (e.g., the bit line direction) in peripheral region 208. Power line mesh 220 can also include a plurality of parallel tooth power lines 222 each extending laterally from shaft power line 224 in peripheral region 208 in the x-direction (e.g., the word line direction) through one core array region 206B, staircase region 204, to another core array region 206A. In some embodiments, power line mesh 220 is in peripheral region 208, core array regions 206A and 206B, and staircase region 204, for example, extending in the x-direction from peripheral region 208 across core array regions 206A and 206B and staircase region 204. In some embodiments, tooth power lines 222 are interleaved with tooth source lines 212 in the y-direction.

In some embodiments, contacts 226 are distributed below and in contact with power line mesh 220 in staircase region 204 and peripheral region 208, but not in core array regions 206A and 206B. As contacts 226 may be TSCs extending through the silicon substrate, contacts 226 are not in core array regions 206A and 206B to avoid overlapping with the channel structures in core array regions 206A and 206B, according to some embodiments. For example, as shown in FIG. 2A, contacts 226 may be distributed below and in contact with shaft power line 224 in peripheral region 208 and parts of tooth power lines 222 in staircase region 204. It is understood that in some examples, contacts 226 may be distributed in either peripheral region 208 or staircase region 204, but not both. That is, contacts 226 can be distributed in at least one of staircase region 204 or peripheral region 208 outside of the memory array in the plan view.

Each contact 226 can be electrically connected to the power line of the peripheral circuits of 3D memory device 200, and power line mesh 220 electrically connects each contact 226 and is in turn, electrically connected to the power line of the peripheral circuits of 3D memory device 200. A power supply can be electrically connected to power line mesh 220 through bonding pads (not shown) to provide power to 3D memory device 200 through the metal routing including contacts 226 and power line mesh 220 on the backside of 3D memory device 200. The bonding pads can be part of the backside interconnect structures and electrically connected to power line mesh 220 through contacts 226. The layout of contacts 226 and power line mesh 220, for example, the comb-like shape of power line mesh 220 and multiple distributed contacts 226, can reduce the overall resistance of the metal routing.

In some embodiments, 3D memory device 200 includes still another backside interconnect structure—a plurality of SSG lines 228 in the plan view. Each SSG line 228 can extend in the x-direction (e.g., the word line direction) across two core array regions 206A and 206B and staircase region 204. In some embodiments, SSG lines 228 are evenly distributed in parallel in the y-direction (e.g., the bit line direction) in the plan view. SSG lines 228, tooth power line 222, and tooth source line 212 can be in parallel. As shown in FIG. 2A, each SSG line 228 can be sandwiched between two tooth power lines 222 in the y-direction. It is understood that the arrangement of SSG lines 228, tooth power line 222, and tooth source line 212 may vary in other examples. For example, SSG lines 228, tooth power line 222, and tooth source line 212 may be interleaved with one another in the y-direction.

In some embodiments, contacts 230 are distributed below and in contact with SSG lines 228 in core array regions 206A and 206B in the plan view, but not in staircase region 204 and peripheral region 208. For example, as shown in FIG. 2A, at least one contact 230 in core array region 206A and at least one contact 230 in core array region 206B are below and in contact with each SSG line 228. The SSG in the memory stack of 3D memory device 200 may be cut off in staircase region 204, becoming two disconnected parts in core array regions 206A and 206B, respectively. Each contact 230 can be electrically connected to one part of the SSG of 3D memory device 200 in respective core array region 206A or 206B. By extending over staircase region 204 between two core array regions 206A and 206B in the x-direction and electrically connecting contacts 230 in each core array region 206A or 206B, SSG lines 228 can thus electrically connect the two disconnected parts of the SSG in core array regions 206A and 206B. That is, the two disconnected parts of the SSG in core array regions 206A and 206B can be "bridged" across staircase region 204 by the metal routing including SSG lines 228 and contacts 230 on the backside of 3D memory device 200. The layout of contacts 230 and SSG lines 228, for example, the multiple parallel SSG lines 228 and multiple distributed contacts 230, can reduce the overall resistance of the metal routing.

It is understood that the backside interconnect structures are not limited to the example in FIG. 2A and may include any other suitable layouts depending on the design of the 3D memory device, such as the specification (e.g., voltage and resistance) of the electrical performance. It is also understood that additional backside interconnect structures may be disposed on the same surface as source line mesh 210, power line mesh 220, and SSG lines 228 as shown in FIG. 2A. For example, bonding pads (not shown) for wire bonding may be disposed on the backside of 3D memory device 200 as well, such as in peripheral region 208. It is further understood that one or more backside interconnect structures shown in FIG. 2A may not be disposed on the backside of the 3D memory devices in other examples, for example, being replaced by counterpart front side interconnect structures disposed on the front side of the 3D memory devices.

Figure 2B:
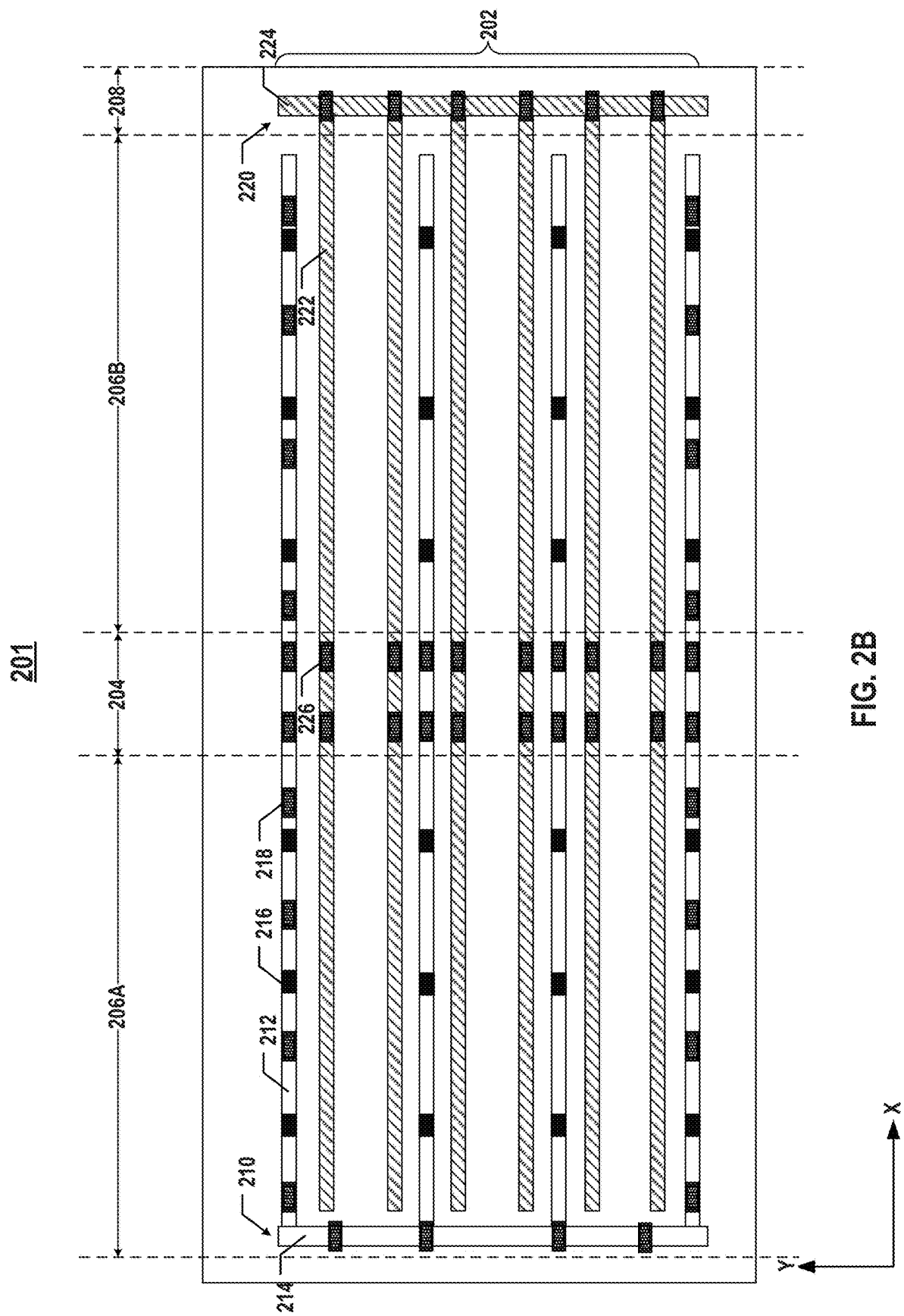
FIG. 2B illustrates a plan view of a cross-section of another exemplary 3D memory device with backside interconnect structures, according to some embodiments of the present disclosure.
Figure 2C:
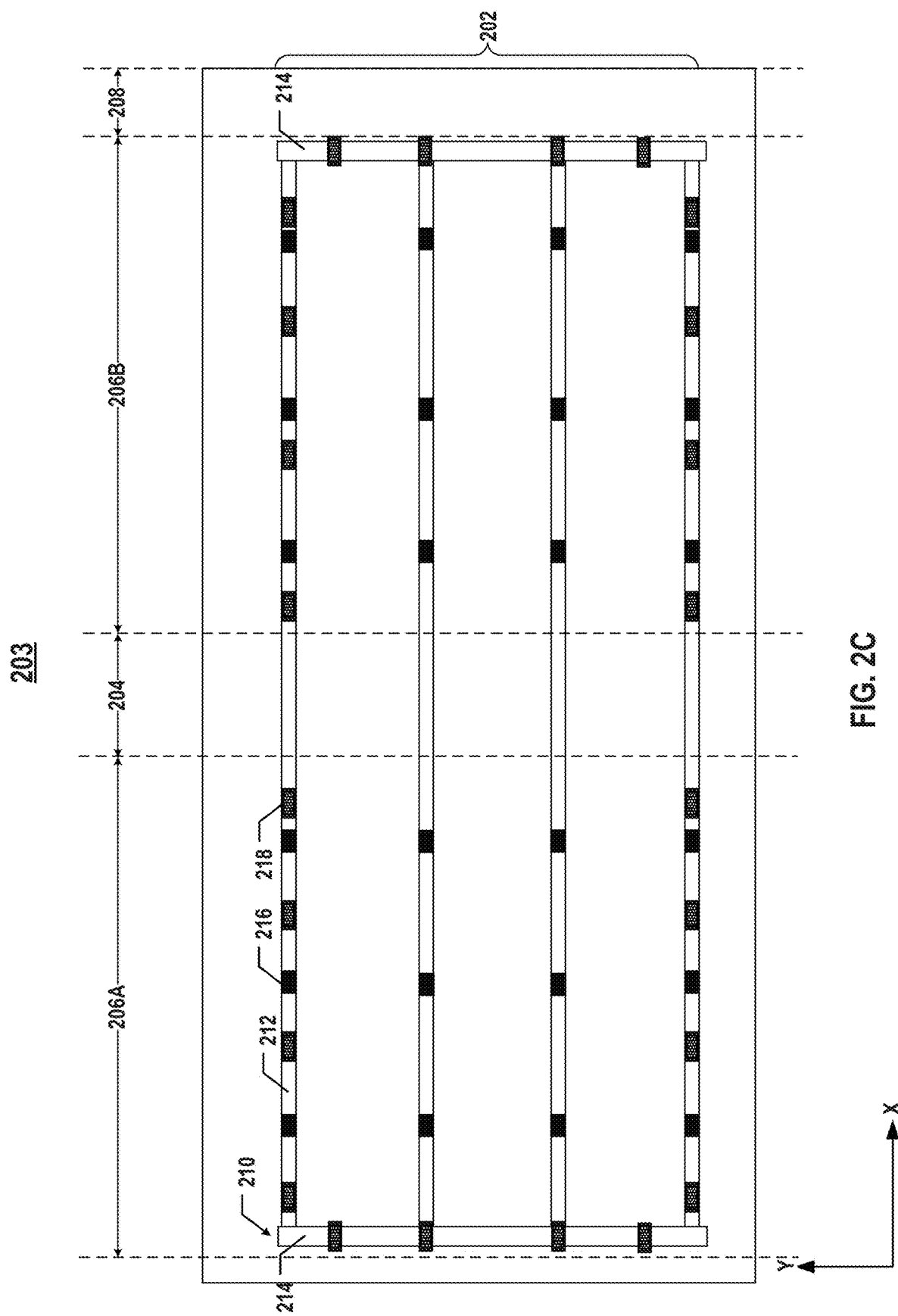
FIG. 2C illustrates a plan view of a cross-section of still another exemplary 3D memory device with backside interconnect structures, according to some embodiments of the present disclosure.

FIG. 2B illustrates a plan view of a cross-section of another exemplary 3D memory device 201 with backside interconnect structures, according to some embodiments of the present disclosure. 3D memory device 201 may be substantially the same as 3D memory device 200 in FIG. 2A except that 3D memory device 201 does not include SSG lines 228 and contacts 230 in FIG. 2A. FIG. 2C illustrates a plan view of a cross-section of still another exemplary 3D memory device 203 with backside interconnect structures, according to some embodiments of the present disclosure. 3D memory device 203 may be substantially the same as 3D memory device 200 in FIG. 2A except that 3D memory device 203 does not include SSG lines 228, power line mesh 220, and contacts 230 and 226 in FIG. 2A. Moreover, by removing power line mesh 220, source line mesh 210 in 3D memory device 203 can have two parallel shaft source lines 214 in core array regions 206A and 206B, respectively.

Figure 3:
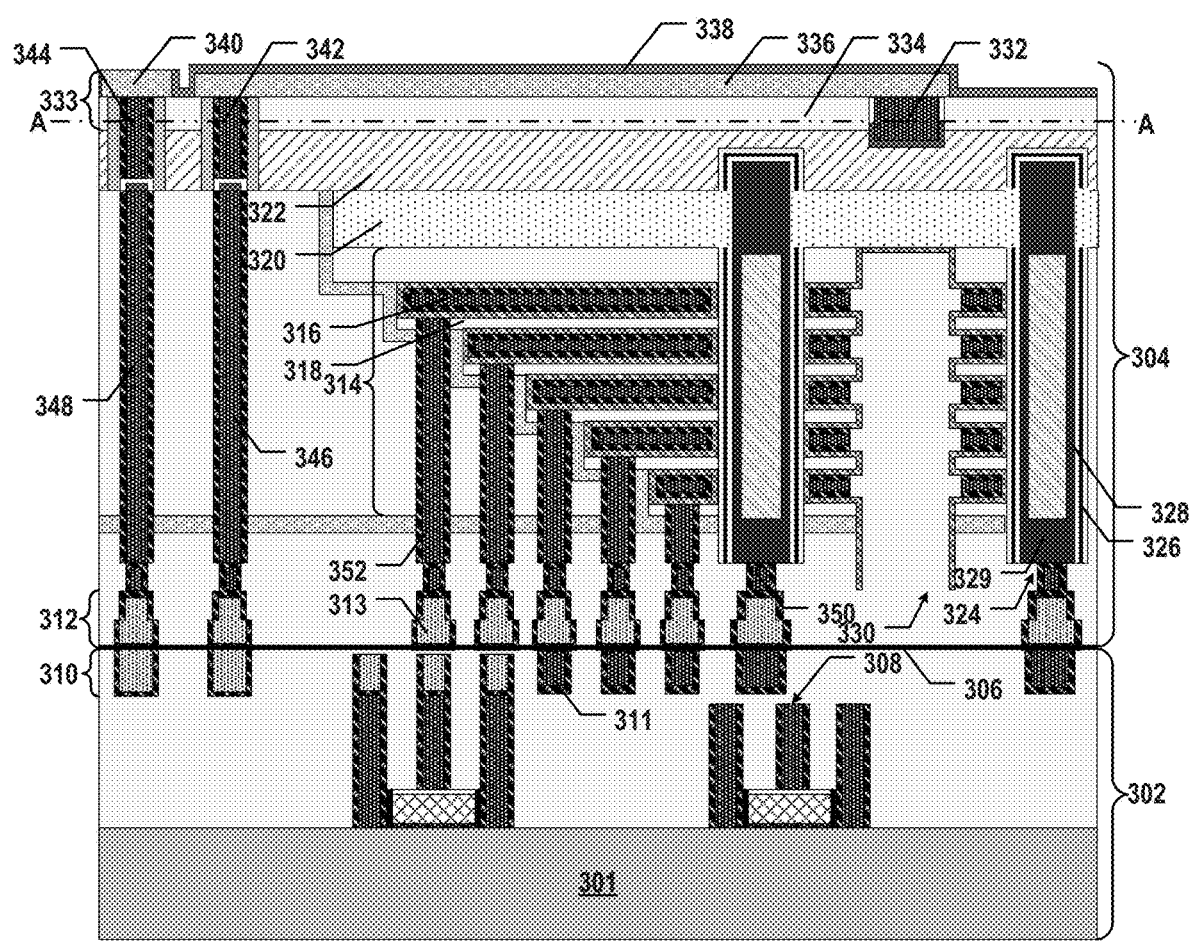
FIG. 3 illustrates a side view of a cross-section of an exemplary 3D memory device with backside interconnect structures, according to some embodiments of the present disclosure.

FIG. 3 illustrates a side view of a cross-section of an exemplary 3D memory device 300 with backside interconnect structures, according to some embodiments of the present disclosure. 3D memory device 300 may be one example of 3D memory devices 200, 201, and 203 in FIGS. 2A-2C. FIGS. 2A-2C may illustrate plan views of the cross-sections in the AA plane of 3D memory device 300 in FIG. 3, i.e., the backside of 3D memory device 300. In some embodiments, 3D memory device 300 is a bonded chip including a first semiconductor structure 302 and a second semiconductor structure 304 stacked over first semiconductor structure 302. First and second semiconductor structures 302 and 304 are jointed at a bonding interface 306 therebetween, according to some embodiments. As shown in FIG. 3, first semiconductor structure 302 can include a substrate 301, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 302 of 3D memory device 300 can include peripheral circuits 308 on substrate 301. It is noted that x-, y-, and z-axes are included in FIG. 3 to illustrate the spatial relationships of the components in 3D memory device 300. Substrate 301 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 300) is determined relative to the substrate of the semiconductor device (e.g., substrate 301) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 308 is configured to control and sense the 3D memory device 300. Peripheral circuit 308 can be any suitable digital, analog, and/or mixed-signal control and sensing circuits used for facilitating the operation of 3D memory device 300 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 308 can include transistors formed "on" substrate 301, in which the entirety or part of the transistors are formed in substrate 301 (e.g., below the top surface of substrate 301) and/or directly on substrate 301. Isolation regions (e.g., shallow trench isolations (STIs)) and doped regions (e.g., source regions and drain regions of the transistors) can be formed in substrate 301 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, etc.), according to some embodiments. It is understood that in some examples, peripheral circuit 308 may further include any other circuits compatible with the advanced logic processes including logic circuits, such as processors and programmable logic devices (PLDs), or memory circuits, such as static random-access memory (SRAM). In some embodiments, peripheral circuits 308 include one or more power lines to provide power (e.g., voltages) to peripheral circuits 308.

In some embodiments, first semiconductor structure 302 of 3D memory device 300 further includes an interconnect layer (not shown) above peripheral circuits 308 to transfer electrical signals to and from peripheral circuits 308. The interconnect layer can include a plurality of interconnects (also referred to herein as "contacts"), including lateral interconnect lines and VIA contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 3, first semiconductor structure 302 of 3D memory device 300 can further include a bonding layer 310 at bonding interface 306 and above the interconnect layer and peripheral circuits 308. Bonding layer 310 can include a plurality of bonding contacts 311 and dielectrics electrically isolating bonding contacts 311. Bonding contacts 311 can include conductive materials including, but not limited to, W, Co, Cu, Al, silicides, or any combination thereof. The remaining area of bonding layer 310 can be formed with dielectrics including, but not limited to, silicon oxide, silicon nitride, silicon oxynitride, low-k dielectrics, or any combination thereof. Bonding contacts 311 and surrounding dielectrics in bonding layer 310 can be used for hybrid bonding.

Similarly, as shown in FIG. 3, second semiconductor structure 304 of 3D memory device 300 can also include a bonding layer 312 at bonding interface 306 and above bonding layer 310 of first semiconductor structure 302. Bonding layer 312 can include a plurality of bonding contacts 313 and dielectrics electrically isolating bonding contacts 313. Bonding contacts 313 can include conductive materials including, but not limited to, W, Co, Cu, Al, silicides, or any combination thereof. The remaining area of bonding layer 312 can be formed with dielectrics including, but not limited to, silicon oxide, silicon nitride, silicon oxynitride, low-k dielectrics, or any combination thereof. Bonding contacts 313 and surrounding dielectrics in bonding layer 312 can be used for hybrid bonding. Bonding contacts 313 are in contact with bonding contacts 311 at bonding interface 306, according to some embodiments.

As described below in detail, second semiconductor structure 304 can be bonded on top of first semiconductor structure 302 in a face-to-face manner at bonding interface 306. In some embodiments, bonding interface 306 is disposed between bonding layers 310 and 312 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 312 and 310 are met and bonded. In practice, bonding interface 306 can be a layer with a certain thickness that includes the top surface of bonding layer 310 of first semiconductor structure 302 and the bottom surface of bonding layer 312 of second semiconductor structure 304.

In some embodiments, second semiconductor structure 304 of 3D memory device 300 further includes an interconnect layer (not shown) above bonding layer 312 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 3, second semiconductor structure 304 of 3D memory device 300 can include an array of channel structures 324 functioning as the array of NAND memory strings. As shown in FIG. 3, each channel structure 324 can extend vertically through a plurality of pairs each including a conductive layer 316 and a dielectric layer 318. The interleaved conductive layers 316 and dielectric layers 318 are part of a memory stack 314. The number of the pairs of conductive layers 316 and dielectric layers 318 in memory stack 314 (e.g., 32, 64, 96, 128, 160, 192, 224, 256, or more) determines the number of memory cells in 3D memory device 300. It is understood that in some examples, memory stack 314 may have a multi-deck architecture (not shown), which includes a plurality of memory decks stacked over one another. The numbers of the pairs of conductive layers 316 and dielectric layers 318 in each memory deck can be the same or different.

Memory stack 314 can include a plurality of interleaved conductive layers 316 and dielectric layers 318. Conductive layers 316 and dielectric layers 318 in memory stack 314 can alternate in the vertical direction. In other words, except the ones at the top or bottom of memory stack 314, each conductive layer 316 can be adjoined by two dielectric layers 318 on both sides, and each dielectric layer 318 can be adjoined by two conductive layers 316 on both sides. Conductive layers 316 can include conductive materials including, but not limited to, W, Co, Cu, Al, polysilicon, doped silicon, silicides, or any combination thereof. Each conductive layer 316 can include a gate electrode (gate line) surrounded by an adhesive layer and a gate dielectric layer. The gate electrode of conductive layer 316 can extend laterally as a word line, ending at one or more staircase structures of memory stack 314. In some embodiments, the uppermost conductive layer 316 functions as the SSG for controlling the source of the NAND memory string. Dielectric layers 318 can include dielectric materials including, but not limited to, silicon oxide, silicon nitride, silicon oxynitride, or any combination thereof.

As shown in FIG. 3, second semiconductor structure 304 of 3D memory device 300 can also include a first semiconductor layer 320 above memory stack 314 and a second semiconductor layer 322 above and in contact with first semiconductor layer 320. The dopant types in each semiconductor layer 320 and 322 may vary in different examples. Semiconductor layers 320 and 322 may be viewed as a single semiconductor layer when semiconductor layers 320 and 322 have the same type of dopants. It is understood that the number of semiconductor layers may be different in other examples and is not limited to the example shown in FIG. 3.

In some embodiments, each channel structure 324 includes a channel hole filled with a semiconductor layer (e.g., as a semiconductor channel 328) and a composite dielectric layer (e.g., as a memory film 326). In some embodiments, semiconductor channel 328 includes silicon, such as amorphous silicon, polysilicon, or single crystalline silicon. In some embodiments, memory film 326 is a composite layer including a tunneling layer, a storage layer (also known as a "charge trap layer"), and a blocking layer. The remaining space of channel structure 324 can be partially or fully filled with a capping layer including dielectric materials, such as silicon oxide, and/or an air gap. Channel structure 324 can have a cylinder shape (e.g., a pillar shape). The capping layer, semiconductor channel 328, the tunneling layer, storage layer, and blocking layer of memory film 326 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 326 can include a composite layer of silicon oxide/silicon oxynitride/silicon oxide (ONO).

In some embodiments, channel structure 324 further includes a channel plug 329 in the bottom portion (e.g., at the lower end) of channel structure 324. As used herein, the "upper end" of a component (e.g., channel structure 324) is the end farther away from substrate 301 in the z-direction, and the "lower end" of the component (e.g., channel structure 324) is the end closer to substrate 301 in the z-direction when substrate 301 is positioned in the lowest plane of 3D memory device 300. Channel plug 329 can include semiconductor materials (e.g., polysilicon). In some embodiments, channel plug 329 functions as the drain of the NAND memory string.

As shown in FIG. 3, each channel structure 324 can extend vertically through interleaved conductive layers 316 and dielectric layers 318 of memory stack 314 and first semiconductor layer 320. In some embodiments, first semiconductor layer 320 surrounds part of channel structure 324 and is in contact with semiconductor channel 328 including polysilicon. That is, memory film 326 is disconnected at part of channel structure 324 that abuts first semiconductor layer 320, exposing semiconductor channel 328 to be in contact with the surrounding first semiconductor layer 320, according to some embodiments. In some embodiments, each channel structure 324 can extend vertically further into second semiconductor layer 322. It is understood that the structure of the top portion of channel structure 324 and its relative position with respect to semiconductor layer 320 and 322 are not limited to the example in FIG. 3 and may vary in other examples.

As shown in FIG. 3, second semiconductor structure 304 of 3D memory device 300 can further include insulating structures 330 each extending vertically through interleaved conductive layers 316 and dielectric layers 318 of memory stack 314. Each insulating structure 330 can also extend laterally to separate channel structures 324 into a plurality of blocks. That is, memory stack 314 can be divided into a plurality of memory blocks by insulating structures 330, such that the array of channel structures 324 can be separated into each memory block. Different from the slit structures in existing 3D NAND memory devices described above, which include front side ACS contacts, insulating structure 330 does not include any contact therein (i.e., not functioning as the source contact) and thus, does not introduce parasitic capacitance and leakage current with conductive layers 316 (including word lines), according to some embodiments. In some embodiments, each insulating structure 330 includes an opening (e.g., a slit) filled with one or more dielectric materials, including, but not limited to, silicon oxide, silicon nitride, silicon oxynitride, or any combination thereof. In one example, each insulating structure 330 may be filled with silicon oxide.

Instead of having front side source contacts, 3D memory device 300 can include backside source contacts 332 above memory stack 314 and in contact with second semiconductor layer 322. Backside source contact 332 may be one example of backside source contact 216 in FIGS. 2A-2C. Source contact 332 and memory stack 314 (and insulating structure 330 therethrough) can be disposed on opposites sides of semiconductor layer 322 (a thinned substrate) and thus, viewed as a "backside" source contact. In some embodiments, source contact 332 extends further into second semiconductor layer 322 and is electrically connected to semiconductor channel 328 of channel structure 324 through semiconductor layers 320 and 322. It is understood that the depth that source contact 332 extends into second semiconductor layer 322 may vary in different examples. In some embodiments in which second semiconductor layer 322 is an N-well, source contact 332 is also known as a backside "N-well pick up." Source contacts 332 can include any suitable types of contacts. In some embodiments, source contacts 332 include a VIA contact (e.g., as backside source contact 216 in FIGS. 2A-2C). In some embodiments, source contacts 332 include a wall-shaped contact extending laterally. Source contact 332 can include one or more conductive layers, such as a metal layer (e.g., W, Co, Cu, or Al) or a silicide layer surrounded by an adhesive layer (e.g., titanium nitride (TiN)).

As shown in FIG. 3, 3D memory device 300 can further include a BEOL backside interconnect layer 333 above and in contact with source contact 332 for pad-out, e.g., transferring electrical signals between 3D memory device 300 and external circuits. Backside interconnect layer 333 may also include the examples of backside interconnect structures described above in FIGS. 2A-2C. In some embodiments, backside interconnect layer 333 includes one or more ILD layers 334 on second semiconductor layer 322 and a redistribution layer 336 on ILD layers 334. The upper end of source contact 332 is flush with the top surface of ILD layers 334 and the bottom surface of redistribution layer 336, and source contact 332 extends vertically through ILD layers 334 into second semiconductor layer 322, according to some embodiments. ILD layers 334 in backside interconnect layer 333 can include dielectric materials including, but not limited to, silicon oxide, silicon nitride, silicon oxynitride, low-k dielectrics, or any combination thereof.

Redistribution layer 336 in backside interconnect layer 333 can include conductive materials including, but not limited to W, Co, Cu, Al, silicides, or any combination thereof. In one example, redistribution layer 336 includes Al. Although not shown in FIG. 3, it is understood that redistribution layer 336 can be patterned to form various types of backside interconnect structures described herein, such as source line mesh 210, power line mesh 220, and SSG lines 228 in FIG. 2A. In one example, source contacts 332 may be below and in contact with source line mesh 210 in redistribution layer 336. In some embodiments, backside interconnect layer 333 further includes a passivation layer 338 as the outmost layer for passivation and protection of 3D memory device 300. Part of redistribution layer 336 can be exposed from passivation layer 338 as bonding pads 340. That is, backside interconnect layer 333 of 3D memory device 300 can also include bonding pads 340 for wire bonding and/or bonding with an interposer. Although not shown in FIGS. 2A-2C, bonding pads 340 may be part of the backside interconnect structures as well in some examples.

In some embodiments, second semiconductor structure 304 of 3D memory device 300 further includes contacts 342 and 344 through second semiconductor layer 322. As second semiconductor layer 322 may be a thinned substrate, contacts 342 and 344 are TSCs, according to some embodiments. Contact 342 may be one example of contact 218 or 226 in FIGS. 2A and 2B. In some embodiments, contact 342 extends through second semiconductor layer 322 and ILD layers 334 to be in contact with redistribution layer 336 (e.g., including source line mesh 210 and power line mesh 220). For example, the source of NAND memory string may be electrically connected to contact 342 (e.g., as contact 218 in FIGS. 2A-2C) through semiconductor layers 320 and 322, source contact 332, and redistribution layer 336 (e.g., having source line mesh 210 in FIGS. 2A-2C). That is, contacts 342 (either as contacts 218 or 226) can be below and in contact with source line mesh 210 or power line mesh 220, respectively, in redistribution layer 336. Although not shown in FIG. 3, as one example of contact 230 in FIG. 2A, 3D memory device 300 may also include contacts (e.g., one example of contacts 230 in FIG. 2A) extending further into memory stack 314 to be in contact with one of conductive layers 316 (i.e., the SSG) of memory stack 314. The contacts (e.g., as contacts 230 in FIG. 2A) can be below and in contact with SSG lines 228 in redistribution layer 336.

In some embodiments, contact 344 extends through second semiconductor layer 322 and ILD layers 334 to be in contact with bonding pad 340. Contacts 342 and 344 each can include one or more conductive layers, such as a metal layer (e.g., W, Co, Cu, or Al) or a silicide layer surrounded by an adhesive layer (e.g., TiN). In some embodiments, at least contact 344 further includes a spacer (e.g., a dielectric layer) to electrically insulate contact 344 from second semiconductor layer 322.

In some embodiments, 3D memory device 300 further includes peripheral contacts 346 and 348 each extending vertically to second semiconductor layer 322 outside of memory stack 314. Each peripheral contact 346 or 348 can have a depth greater than the depth of memory stack 314 to extend vertically from bonding layer 312 to second semiconductor layer 322 in a peripheral region corresponding to, for example, peripheral region 208 and staircase region 204 in FIG. 2A-2C or the peripheral regions of core array regions 206A and 206B in which contacts 218 are disposed. In some embodiments, peripheral contact 346 is below and in contact with contact 342, such that source line mesh 210 or power line mesh 220 is electrically connected to peripheral circuit 308 in first semiconductor structure 302. In one example, the source of NAND memory string may be electrically connected to the part of peripheral circuit 308 for controlling/sensing the source of NAND memory string through redistribution layer 336 (e.g., including source line mesh 210), contact 342 (e.g., as contact 218), and peripheral contact 346. In another example, the power supply may be electrically connected to the power line of peripheral circuit 308 to provide power to 3D memory device 300 through redistribution layer 336 (e.g., including power line mesh 220), contact 342 (e.g., as contact 226), and peripheral contact 346 In some embodiments, peripheral contact 348 is below and in contact with contact 344, such that peripheral circuit 308 in first semiconductor structure 302 is electrically connected to bonding pad 340 for pad-out through at least contact 344 and peripheral contact 348. Peripheral contacts 346 and 348 each can include one or more conductive layers, such as a metal layer (e.g., W, Co, Cu, or Al) or a silicide layer surrounded by an adhesive layer (e.g., TiN).

As shown in FIG. 3, 3D memory device 300 also includes a variety of local contacts (also known as "C1") as part of the interconnect structure, which are in contact with a structure in memory stack 314 directly. In some embodiments, the local contacts include channel local contacts 350 each below and in contact with the lower end of a respective channel structure 324. Each channel local contact 350 can be electrically connected to a bit line contact (not shown) for bit line fan-out. In some embodiments, the local contacts further include word line local contacts 352 each below and in contact with a respective conductive layer 316 (including a word line) at the staircase structure of memory stack 314 for word line fan-out. Local contacts, such as channel local contacts 350 and word line local contacts 352, can be electrically connected to peripheral circuits 308 of first semiconductor structure 302 through at least bonding layers 312 and 310. Local contacts, such as channel local contacts 350 and word line local contacts 352, each can include one or more conductive layers, such as a metal layer (e.g., W, Co, Cu, or Al) or a silicide layer surrounded by an adhesive layer (e.g., TiN).

Figure 4:
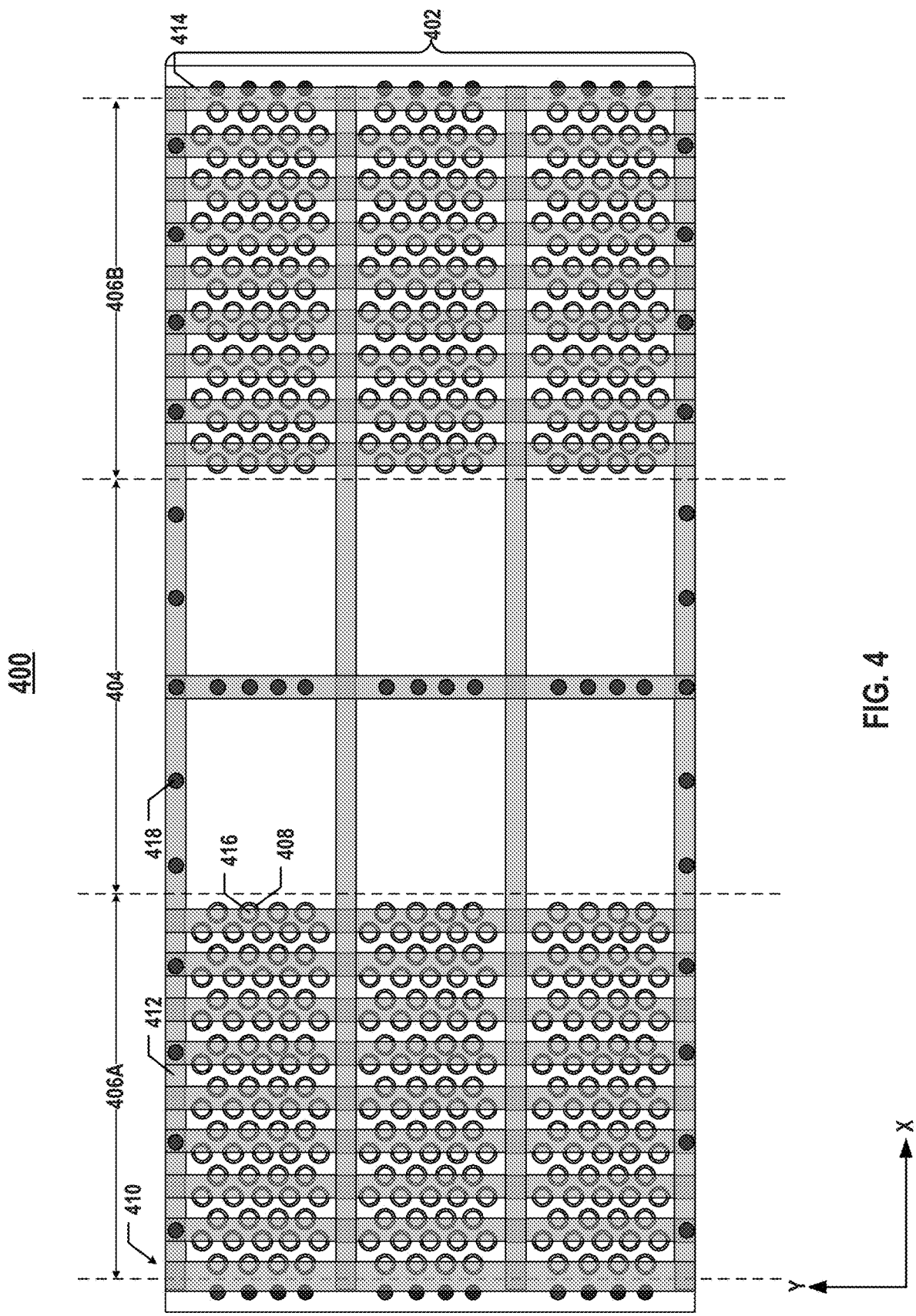
FIG. 4 illustrates a plan view of a cross-section of yet another exemplary 3D memory device with backside interconnect structures, according to some embodiments of the present disclosure.

FIG. 4 illustrates a plan view of a cross-section of yet another exemplary 3D memory device 400 with backside interconnect structures, according to some embodiments of the present disclosure. 3D memory device 400 may be one example of 3D memory device 100 after flip-chip bonding, and FIG. 4 shows one example of the backside of 3D memory device 100 after flip-chip bonding. As shown in FIG. 4, the memory stack of 3D memory device 400 includes two core array regions 406A and 406B having channel structures 408 therein and a staircase region 404 between core array regions 406A and 406B in the x-direction (e.g., the word line direction) in the plan view, according to some embodiments. In the y-direction (e.g., the bit line direction), FIG. 4 shows backside interconnect structures in one block 402 of 3D memory device 400, which may be repeated in any suitable number of times in multiple blocks.

In some embodiments, 3D memory device 400 includes a source line mesh 410 in the plan view. In some embodiments, source line mesh 410 is in core array regions 406A and 406B and staircase region 404. As shown in FIG. 4, source line mesh 410 includes a plurality of parallel source lines 412 each extending laterally in the x-direction (e.g., the word line direction) across staircase region 404 and core array regions 406A and 406B in the plan view, similar to tooth source lines 212 of source line mesh 210 in FIGS. 2A-2C, according to some embodiments. Different from source line mesh 210 having a single shaft source line 214 in FIGS. 2A and 2B, source line mesh 410 may also include a plurality of parallel source lines 414 each extending laterally in the y-direction (e.g., the bit line direction) in the plan view. Parallel source lines 414 can be disposed in core array regions 406A and 406B and in staircase region 404, as shown in FIG. 4. It is understood that in some examples, source lines 414 may not be disposed in staircase region 404, but only in core array regions 406A and 406B.

3D memory device 400 can also include backside source contacts 416 (e.g., in the form of VIA contacts) in core array regions 406A and 406B, but not in staircase region 404. For example, backside source contacts 416 may be evenly distributed in core array region 406A or 406B. As shown in FIG. 4, each channel structure 408 is below and aligned laterally with a respective one of backside source contacts 416, according to some embodiments. That is, each channel structure 408 can be overlapped with a respective backside source contact 416 directly on top of channel structure 408, thereby reducing the resistance between the source of the NAND memory string and backside source contact 416. In some embodiments, since channel structures 408 are arranged in an array having rows and columns, backside source contacts are also arranged in an array having rows and columns. Each source line 414 or 412 can be in contact with each of backside source contacts 416 in a row or a column in the array in the plan view. In some embodiments, each source line 414 extending in the y-direction can be in contact with each of backside source contacts 416 in a column. It is understood that in some examples, each source line 412 extending in the x-direction may be in contact with each of backside source contacts 416 in a row. In some embodiments, each source line 414 or 412 is in contact with each of backside source contacts 416 in two adjacent rows or columns in the array in the plan view. For example, as shown in FIG. 4, each source line 414 extending in the y-direction may be in contact with each of backside source contacts 416 in two adjacent columns. Although not shown, similarly, each source line 412 extending in the x-direction may be in contact with each of backside source contacts 416 in two adjacent rows in other examples.

3D memory device 400 can further include contacts 418, such as TSCs. In some embodiments, contacts 418 are distributed below and in contact with source line mesh 410 in staircase region 404 and part of core array regions 406A and 406B. As contacts 418 may be TSCs extending through the silicon substrate, contacts 418 are distributed below and in contact with the peripheral portion of source line mesh 410 (including the part in staircase region 404) to avoid overlapping with channel structures 408 in the center portion of source line mesh 410 in core array regions 406A and 406B, according to some embodiments. For example, as shown in FIG. 4, contacts 418 may be distributed below and in contact with outermost source lines 412 and 414 in core array regions 406A and 406B. Contacts 418 may also be distributed below and in contact with source line 414 in staircase region 404.

As described below in detail, each backside source contact 416 can be electrically connected to the source of a respective NAND memory strings, and source line mesh 410 electrically connects each backside source contact 416 and is in turn, electrically connected to the sources of the NAND memory strings. Similarly, each contact 418 can be electrically connected the peripheral circuits of 3D memory device 400, and source line mesh 410 electrically connects each contact 418 and is in turn, electrically connected to the peripheral circuits of 3D memory device 400. As a result, the peripheral circuits can be electrically connected to the sources of the NAND memory strings to control and/or sense the sources through the metal routing including contacts 418, source line mesh 410, and backside source contacts 416 on the backside of 3D memory device 400. Compared with the examples in FIGS. 2A-2C, the layout of contacts 418, source line mesh 410, and backside source contacts 416, for example, the array of backside source contacts 416 corresponding to the array of channel structures 408, and source lines 414 each contacting backside source contacts 416 in two adjacent columns in core array regions 406A and 406B, can further reduce the overall resistance of the metal routing.

Figure 5:
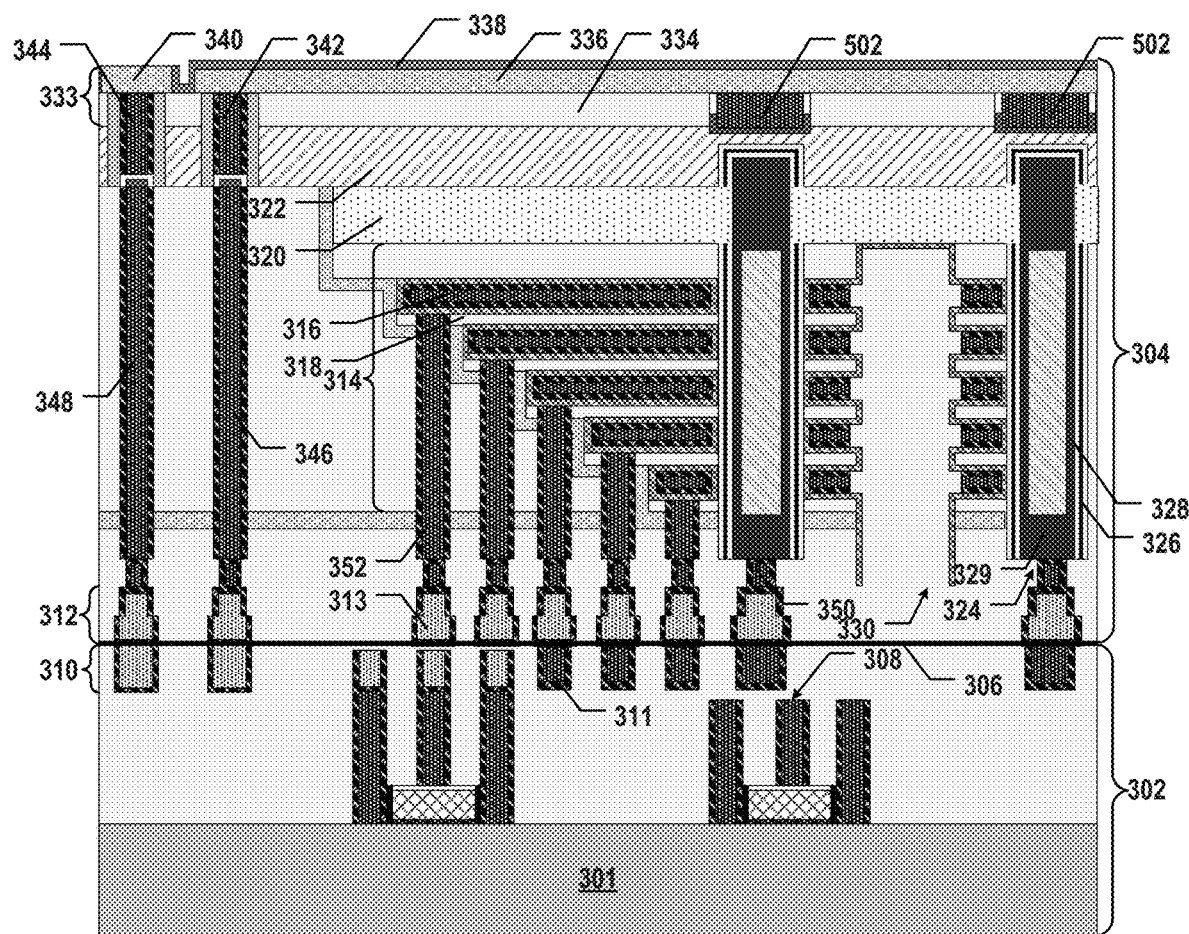
FIG. 5 illustrates a side view of a cross-section of another exemplary 3D memory device with backside interconnect structures, according to some embodiments of the present disclosure.

FIG. 5 illustrates a side view of a cross-section of another exemplary 3D memory device 500 with backside interconnect structures, according to some embodiments of the present disclosure. 3D memory device 500 may be one example of 3D memory device 400 in FIG. 4. 3D memory 500 is similar to 3D memory device 300 in FIG. 3 except for the arrangement of source contacts 502. As shown in FIG. 5, each channel structure 324 is below and aligned laterally (e.g., in both x- and y-directions) with a respective source contact 502 (e.g., one example of backside source contact 416 in FIG. 4), which is in contact with semiconductor layer 322. It is understood that the details of other same structures in both 3D memory devices 500 and 300 are not repeated for ease of description.

Figure 6A:
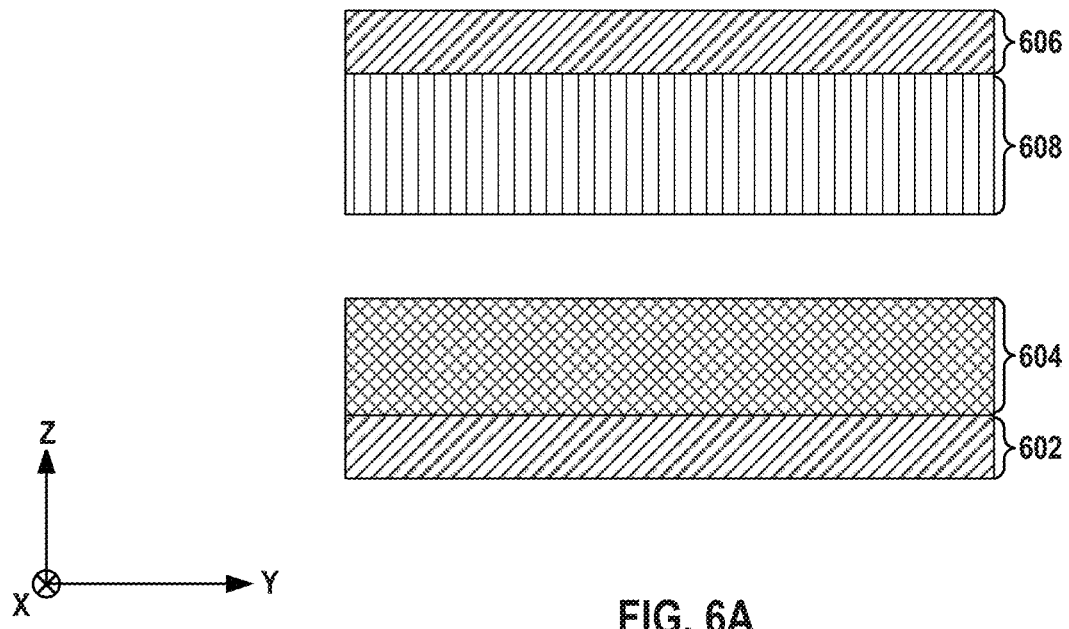
FIGS. 6A-6D illustrate a fabrication process for forming an exemplary 3D memory device with backside interconnect structures, according to some embodiments of the present disclosure.
Figure 6B:
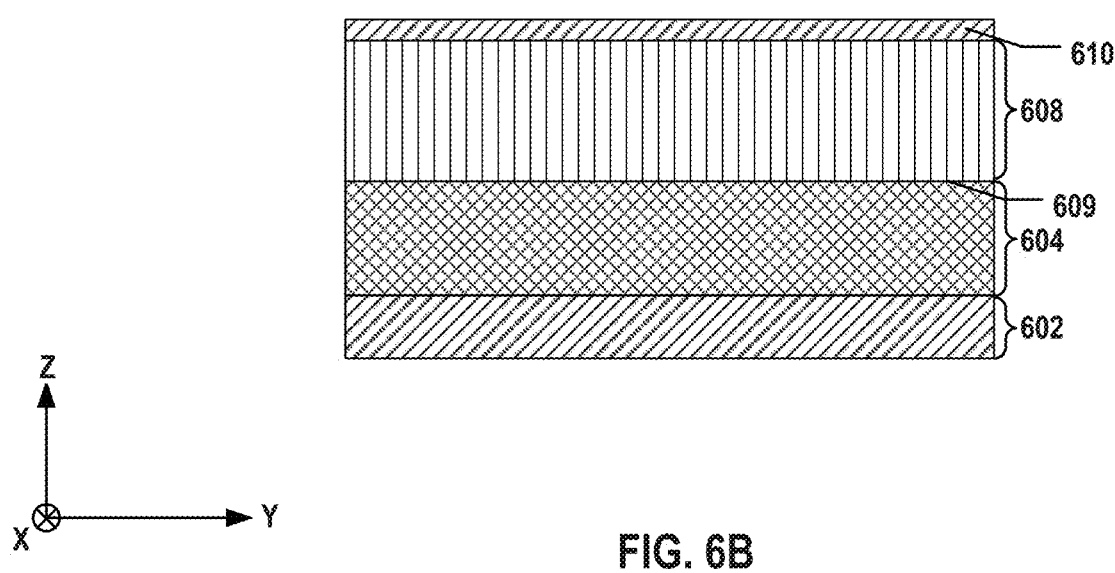
Figure 6C:
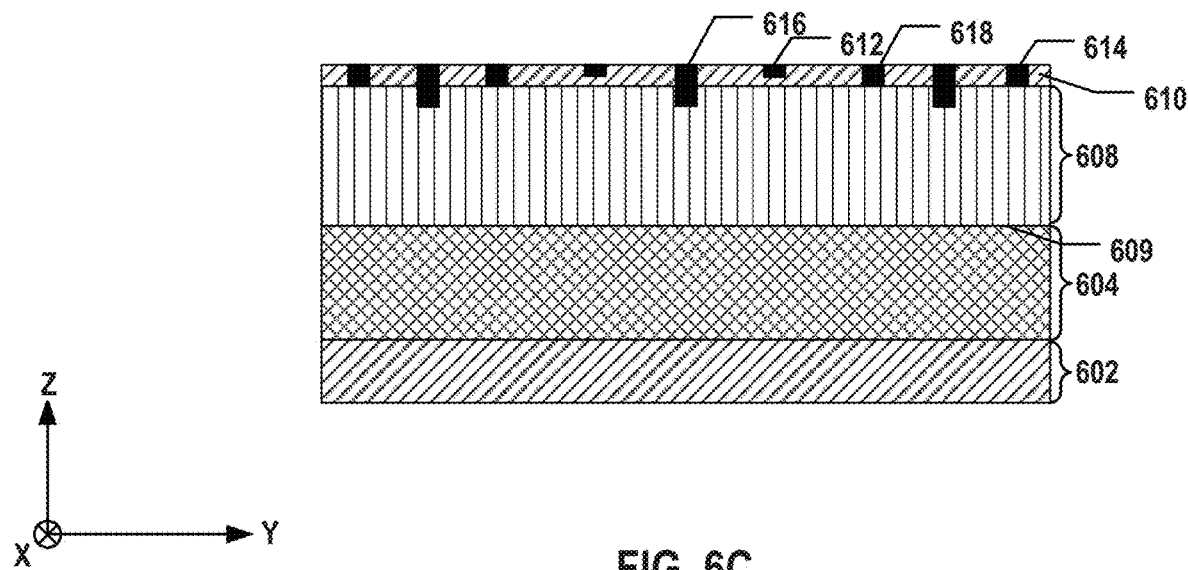
Figure 6D:
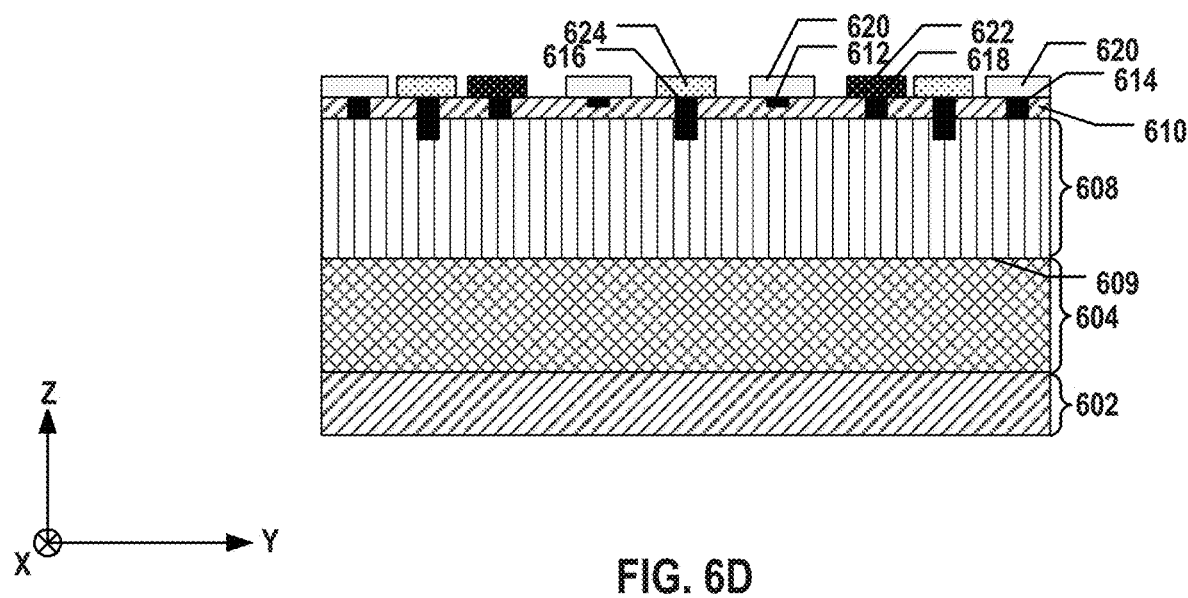
Figure 7:
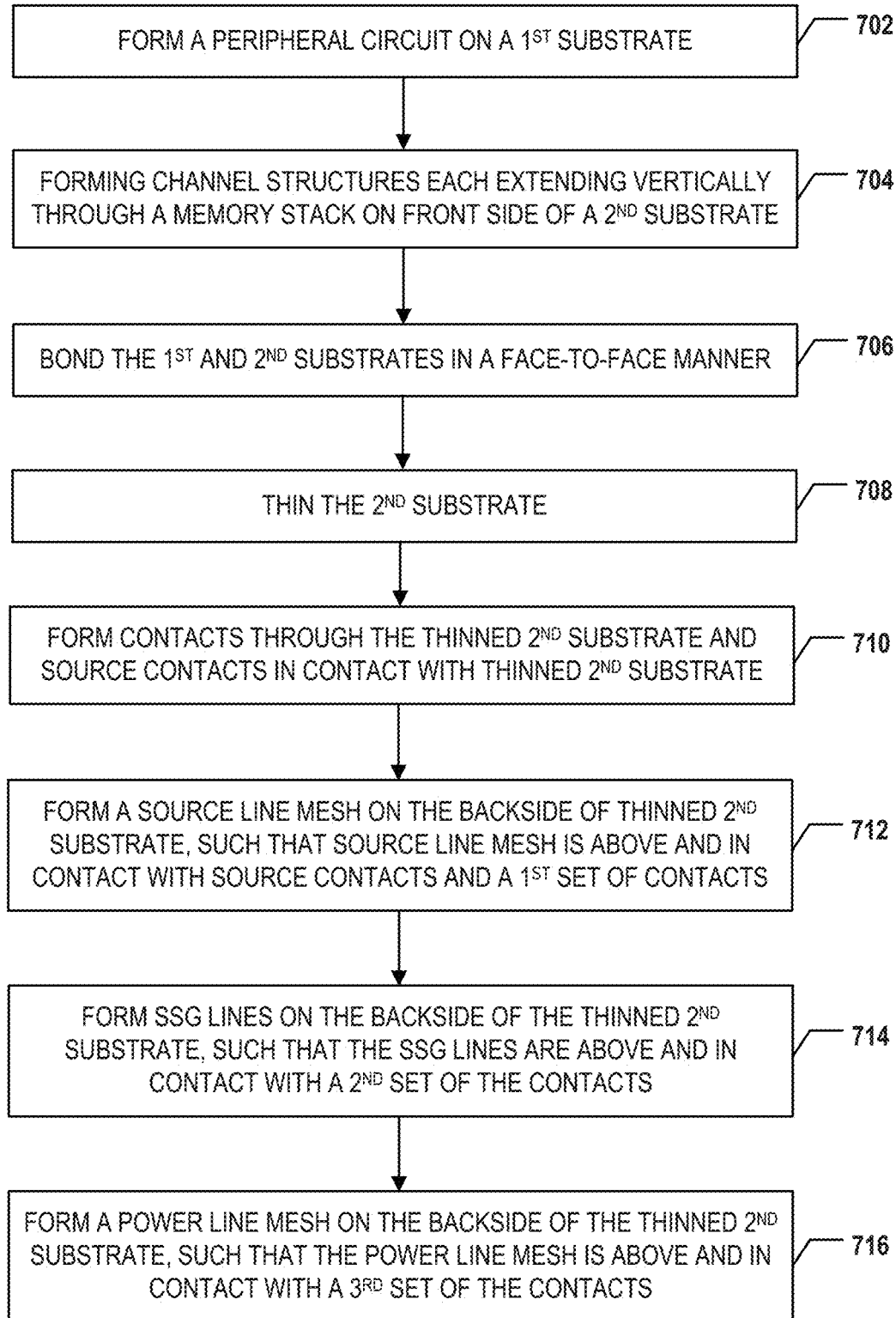
FIG. 7 illustrates a flowchart of a method for forming an exemplary 3D memory device with backside interconnect structures, according to some embodiments of the present disclosure.

FIGS. 6A-6D illustrate a fabrication process for forming an exemplary 3D memory device with backside interconnect structures, according to some embodiments of the present disclosure. FIG. 7 illustrates a flowchart of a method 700 for forming an exemplary 3D memory device with backside interconnect structures, according to some embodiments of the present disclosure. Examples of the 3D memory device depicted in FIGS. 6A-6D and 7 include 3D memory devices 200, 201, 203, and 400 depicted in FIGS. 2A-2C and 4. FIGS. 6A-6D and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a peripheral circuit is formed on a first substrate. The first substrate can be a silicon substrate. As illustrated in FIG. 6A, peripheral circuits 604 having a plurality of transistors are formed on a first silicon substrate 602 using a plurality of processes including, but not limited to, photolithography, etching, thin film deposition, thermal growth, implantation, chemical mechanical polishing (CMP), and any other suitable processes.

Method 700 proceeds to operation 704, as illustrated in FIG. 7, in which a plurality of channel structures each extending vertically through a memory stack are formed on a front side of a second substrate. In some embodiments, the memory stack includes two core array regions having the channel structures and a staircase region between the two core array regions in a first lateral direction in a plan view. As illustrated in FIG. 6A, an array of channel structures 608 each extending vertically through a memory stack are formed on the front side of a second silicon substrate 606.

Method 700 proceeds to operation 706, as illustrated in FIG. 7, in which the first substrate and the second substrate are bonded in a face-to-face manner, such that the channel structures are above the peripheral circuit. The bonding can include hybrid bonding. As illustrated in FIGS. 6A and 6B, second silicon substrate 606 and components formed thereon (e.g., channel structures 608) are flipped upside down and bonded with first silicon substrate 602 and components formed thereon (e.g., peripheral circuits 604) facing up, i.e., in a face-to-face manner, thereby forming a bonding interface 609 between silicon substrates 602 and 606, according to some embodiments.

Method 700 proceeds to operation 708, as illustrated in FIG. 7, in which the second substrate is thinned. The thinning is performed from the backside of the second substrate. As illustrated in FIG. 6B, second silicon substrate 606 (shown in FIG. 6A) is thinned from the backside to become a semiconductor layer 610 (i.e., the thinned second silicon substrate 606) using CMP, grinding, dry etching, and/or wet etching.

Method 700 proceeds to operation 710, as illustrated in FIG. 7, in which a plurality of contacts are formed through the thinned second substrate, and a plurality of source contacts are formed in contact with the thinned second substrate. The contacts and source contacts are formed from the backside of the thinned second substrate. In some embodiments, each of the channel structures is below and aligned laterally with a respective one of the source contacts. In some embodiments, the source contacts are arranged in an array having rows and columns. As illustrated in FIG. 6C, backside source contacts 612 are formed from the backside of semiconductor layer 610 and in contact with semiconductor layer 610. In some embodiments, each channel structure 608 is below and aligned laterally with a respective backside source contact 612. A plurality of TSCs 614, 616, and 618 can be formed from the backside of semiconductor layer 610 through semiconductor layer 610. In some embodiments, TSCs 616 extend further into the memory stack to be in contact with the SSG in the memory stack.

Method 700 proceeds to operation 712, as illustrated in FIG. 7, in which a source line mesh is formed on the backside of the thinned second substrate, such that the source line mesh is above and in contact with the plurality of source contacts and a first set of the plurality of contacts. In some embodiments, the source line mesh includes a plurality of parallel source lines each extending laterally in the plan view. In some embodiments, source line mesh is above and in contact with each of the source contacts. In some embodiments, each of the source lines is in contact with each of the source contacts in a row or a column in the array in the plan view. In some embodiments, each of the source lines is in contact with each of the source contacts in two adjacent rows or columns in the array in the plan view. As illustrated in FIG. 6D, a source line mesh 620 is formed on the backside of semiconductor layer 610, such that source line mesh 620 is above and in contact with backside source contracts 612 as well as TSCs 614. The layout of source line mesh 620, backside source contacts 612, and TSCs 614 may vary in different examples, for example, as in the examples shown in FIGS. 2A-2C and 4.

Method 700 proceeds to operation 714, as illustrated in FIG. 7, in which a plurality of SSG lines are formed on the backside of the thinned second substrate, such that the SSG lines are above and in contact with a second set of the plurality of contacts. In some embodiments, each of the SSG lines extends in the first lateral direction across the two core array regions and the staircase region, and the second set of the contacts are distributed in the core array regions in the plan view. In some embodiments, the SSG lines are evenly distributed in parallel in a second lateral direction perpendicular to the first lateral direction in the plan view. As illustrated in FIG. 6D, SSG lines 624 are formed on the backside of semiconductor layer 610, such that SSG lines 624 are above and in contact with TSCs 616. The layout of SSG lines 624 and TSCs 616 may vary in different examples, for example, as in the example shown in FIG. 2A.

Method 700 proceeds to operation 716, as illustrated in FIG. 7, in which a power line mesh is formed on the backside of the thinned second substrate, such that the power line mesh is above and in contact with a third set of the plurality of contacts. In some embodiments, the third set of the contacts are distributed in at least one of the staircase region or a peripheral region outside of the memory array in the plan view. As illustrated in FIG. 6D, a power line mesh 622 is formed on the backside of semiconductor layer 610, such that power line mesh 622 is above and in contact with TSCs 618. The layout of power line mesh 622 and TSCs 618 may vary in different examples, for example, as in the example shown in FIGS. 2A and 2B. It is understood that although operations 712, 714, and 716 are described above as three sequential operations, operations 712, 714, and 716 may be performed in the same fabrication processes. For example, one or more of source line mesh 620, power line mesh 622, and SSG lines 624 may be patterned and formed in the same fabrication processes.

According to one aspect of the present disclosure, a 3D memory device includes a substrate, a memory stack including interleaved conductive layers and dielectric layers above the substrate, a plurality of channel structures each extending vertically through the memory stack, a semiconductor layer above and in contact with the plurality of channel structures, a plurality of source contacts above the memory stack and in contact with the semiconductor layer, a plurality of contacts through the semiconductor layer, and a backside interconnect layer above the semiconductor layer including a source line mesh in a plan view. The plurality of source contacts are distributed below and in contact with the source line mesh. A first set of the plurality of contacts are distributed below and in contact with the source line mesh.

In some embodiments, the memory stack includes two core array regions having the channel structures and a staircase region between the two core array regions in a first lateral direction in the plan view.

In some embodiments, the backside interconnect layer further includes a plurality of SSG lines in the plan view, and a second set of the plurality of contacts are distributed below and in contact with the SSG lines.

In some embodiments, each of the SSG lines extends in the first lateral direction across the two core array regions and the staircase region, and the second set of the contacts are distributed in the core array regions in the plan view.

In some embodiments, each of the second set of contacts extends further into the memory stack to be is in contact with one of the conductive layers of the memory stack.

In some embodiments, the SSG lines are evenly distributed in parallel in a second lateral direction perpendicular to the first lateral direction in the plan view.

In some embodiments, the backside interconnect layer further includes a power line mesh in the plan view, and a third set of the plurality of contacts are distributed below and in contact with the power line mesh.

In some embodiments, the third set of the contacts are distributed in at least one of the staircase region or a peripheral region outside of the memory array in the plan view.

In some embodiments, the power line mesh has a comb-like shape.

In some embodiments, the backside interconnect layer further includes a bonding pad electrically connected to the power line mesh through the third set of the contacts.

In some embodiments, the source line mesh has a comb-like shape.

According to another aspect of the present disclosure, a 3D memory device includes a substrate, a memory stack including interleaved conductive layers and dielectric layers above the substrate, a plurality of channel structures each extending vertically through the memory stack, a semiconductor layer above and in contact with the plurality of channel structures, a plurality of source contacts in contact with the semiconductor layer, and a backside interconnect layer above the semiconductor layer including a source line mesh in a plan vie. Each of the channel structures is below and aligned laterally with a respective one of the source contacts. The source line mesh is above and in contact with each of the source contacts.

In some embodiments, the 3D memory device further includes a plurality of contacts through the semiconductor layer and distributed below and in contact with the source line mesh.

In some embodiments, the memory stack includes one or more core array regions having the channel structures, and the contacts are distributed outside of the core array regions in the plan view.

In some embodiments, the source line mesh includes a plurality of parallel source lines each extending laterally in the plan view.

In some embodiments, the source contacts are arranged in an array, and each of the source lines is in contact with each of the source contacts in a row or a column in the array in the plan view.

In some embodiments, each of the source lines is in contact with each of the source contacts in two adjacent rows or columns in the array in the plan view.

According to still another aspect of the present disclosure, a method for forming a 3D memory device is disclosed. A peripheral circuit is formed on a first substrate. A plurality of channel structures each extending vertically through a memory stack on a front side of a second substrate are formed. The first substrate and the second substrate are bonded in a face-to-face manner, such that the channel structures are above the peripheral circuit. The second substrate is thinned. A plurality of contacts through the thinned second substrate and a plurality of source contacts in contact with the thinned second substrate are formed. A source line mesh is formed on the backside of the thinned second substrate, such that the source line mesh is above and in contact with the plurality of source contacts and a first set of the plurality of contacts.

In some embodiments, the memory stack includes two core array regions having the channel structures and a staircase region between the two core array regions in a first lateral direction in a plan view.

In some embodiments, a plurality of SSG lines are formed on the backside of the thinned second substrate, such that the SSG lines are above and in contact with a second set of the plurality of contacts.

In some embodiments, each of the SSG lines extends in the first lateral direction across the two core array regions and the staircase region, and the second set of the contacts are distributed in the core array regions in the plan view.

In some embodiments, the SSG lines are evenly distributed in parallel in a second lateral direction perpendicular to the first lateral direction in the plan view.

In some embodiments, a power line mesh is formed on the backside of the thinned second substrate, such that the power line mesh is above and in contact with a third set of the plurality of contacts.

In some embodiments, the source line mesh includes a plurality of parallel source lines each extending laterally in the plan view.

In some embodiments, each of the channel structures is below and aligned laterally with a respective one of the source contacts, and the source line mesh is above and in contact with each of the source contacts.

In some embodiments, the source contacts are arranged in an array, and each of the source lines is in contact with each of the source contacts in a row or a column in the array in the plan view.

In some embodiments, each of the source lines is in contact with each of the source contacts in two adjacent rows or columns in the array in the plan view.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising interleaved conductive layers and dielectric layers on a first side of a semiconductor layer;
   a plurality of channel structures each extending vertically through the memory stack and in contact with the first side of the semiconductor layer;
   a plurality of source contacts in contact with a second side of the semiconductor layer opposite to the first side;
   a plurality of contacts through the semiconductor layer; and
   a backside interconnect layer on the second side of the semiconductor layer and comprising a source line mesh in a plan view, wherein the plurality of source contacts and a first set of the plurality of contacts are in contact with the source line mesh.

2. The 3D memory device of claim 1, wherein the memory stack comprises two core array regions having the channel structures and a staircase region between the two core array regions in a first lateral direction in the plan view.

3. The 3D memory device of claim 2, wherein the backside interconnect layer further comprises a plurality of source select gate (SSG) lines in the plan view, and a second set of the plurality of contacts are in contact with the SSG lines.

4. The 3D memory device of claim 3, wherein each of the SSG lines extends in the first lateral direction across the two core array regions and the staircase region, and the second set of the contacts are distributed in the core array regions in the plan view.

5. The 3D memory device of claim 3, wherein each of the second set of contacts extends further into the memory stack and is in contact with one of the conductive layers of the memory stack.

6. The 3D memory device of claim 3, wherein the SSG lines are evenly distributed in parallel in a second lateral direction perpendicular to the first lateral direction in the plan view.

7. The 3D memory device of claim 2, wherein the backside interconnect layer further comprises a power line mesh in the plan view, and a third set of the plurality of contacts are in contact with the power line mesh.

8. The 3D memory device of claim 7, wherein the third set of the contacts are distributed in at least one of the staircase region or a peripheral region outside of the core array regions in the plan view.

9. The 3D memory device of claim 7, wherein each of the power line mesh and the source line mesh has a comb-like shape.

10. The 3D memory device of claim 7, wherein the backside interconnect layer further comprises a bonding pad electrically connected to the power line mesh through the third set of the contacts.

11. A three-dimensional (3D) memory device, comprising:
    a memory stack comprising interleaved conductive layers and dielectric layers on a first side of a semiconductor layer;
    a plurality of channel structures each extending vertically through the memory stack and in contact with the first side of the semiconductor layer;
    a plurality of source contacts in contact with a second side of the semiconductor layer opposite to the first side, wherein each of the source contacts is aligned vertically with a respective one of the channel structures; and
    a backside interconnect layer on the second side of the semiconductor layer and comprising a source line mesh in a plan view, wherein the source line mesh is in contact with each of the source contacts.

12. The 3D memory device of claim 11, further comprising a plurality of contacts through the semiconductor layer and in contact with the source line mesh.

13. The 3D memory device of claim 12, wherein the memory stack comprises one or more core array regions having the channel structures, and the contacts are distributed outside of the core array regions in the plan view.

14. The 3D memory device of claim 11, wherein the source line mesh comprises a plurality of parallel source lines each extending laterally in the plan view.

15. The 3D memory device of claim 14, wherein the source contacts are arranged in an array, and each of the source lines is in contact with each of the source contacts in a row or a column in the array in the plan view.

16. The 3D memory device of claim 15, wherein each of the source lines is in contact with each of the source contacts in two adjacent rows or columns in the array in the plan view.

17. A memory device, comprising:
    a semiconductor layer;
    a memory stack on a front side of the semiconductor layer;

backside source contacts in contact with a back side of the semiconductor layer;

through contacts each penetrating through and insulated from the semiconductor layer; and a backside interconnect layer on the back side of the semiconductor layer and comprising a source line mesh in contact with the backside source contacts and a first subset of the through contacts.

18. The memory device of claim 17, wherein the memory stack comprises:

interleaved conductive layers and dielectric layers; and channel structures each extending vertically through the interleaved conductive layers and dielectric layers and in contact with the front side of the semiconductor layer, wherein a second subset of the through contacts extend into the memory stack and are in contact with at least one conductive layer in the memory stack.

19. The memory device of claim 18, wherein the backside interconnect layer further comprises:

source select gate (SSG) lines in contact with the second subset of the through contacts;

a power line mesh in contact with a third subset of the through contacts; and wherein the source line mesh, the power line mesh, and the source select gate (SSG) lines are embedded in a same level in the backside interconnect layer.

20. The memory device of claim 19, wherein:

the backside source contacts and the second subset of the through contacts are located in an array region; and the third subset of the through contacts are located in a staircase region; and the first subset of the through contacts are located in both the array region and the staircase region.

* * * * *